(12) United States Patent
Han et al.

(10) Patent No.: US 10,199,528 B2
(45) Date of Patent: Feb. 5, 2019

(54) MESOSCOPIC SOLAR CELL BASED ON PEROVSKITE LIGHT ABSORPTION MATERIAL AND METHOD FOR MAKING THE SAME

(71) Applicant: Huazhong University of Science and Technology, Wuhan (CN)

(72) Inventors: Hongwei Han, Wuhan (CN); Zhiliang Ku, Wuhan (CN)

(73) Assignee: WONDER SOLAR LIMITED LIABILITY COMPANY, Ezhou (CN)

( * ) Notice: Subject to any disclaimer, the term of this patent is extended or adjusted under 35 U.S.C. 154(b) by 0 days.

(21) Appl. No.: 14/985,470

(22) Filed: Dec. 31, 2015

(65) Prior Publication Data

US 2016/0111575 A1    Apr. 21, 2016

Related U.S. Application Data

(63) Continuation-in-part of application No. PCT/CN2014/072510, filed on Feb. 25, 2014.

(51) Int. Cl.

| | |
|---|---|
| *H01L 31/00* | (2006.01) |
| *H01L 31/18* | (2006.01) |
| *H01L 51/42* | (2006.01) |
| *H01L 31/0384* | (2006.01) |
| *H01L 31/072* | (2012.01) |

(52) U.S. Cl.
CPC .......... *H01L 31/18* (2013.01); *H01L 31/0384* (2013.01); *H01L 31/072* (2013.01); *H01L 51/422* (2013.01); *Y02E 10/549* (2013.01); *Y02P 70/521* (2015.11)

(58) Field of Classification Search
CPC ... H01L 31/072; H01L 31/18; H01L 31/0384; H01L 51/422; Y02E 10/549
USPC ................................................. 136/258, 263
See application file for complete search history.

(56) References Cited

FOREIGN PATENT DOCUMENTS

| CN | 101740238 A | * | 6/2010 | .......... H01G 9/2031 |
| KR | 101172374 B1 | | 8/2012 | |
| WO | 9716838 A1 | | 5/1997 | |

OTHER PUBLICATIONS

Snaith et al., "Advances in Liquid-Electrolyte and Solid-State Dye-Sensitized Solar Cells," Adv. Mater. 2007, 19, 3187-3200.*
Kojima et al., "Organometal Halide Perovskites as Visible-Light Sensitizers for Photovoltaic Cells," J. Am. Chem. Soc., 2009, 131 (17), pp. 6050-6051.*

(Continued)

*Primary Examiner* — Angelo Trivisonno
(74) *Attorney, Agent, or Firm* — Matthias Scholl P.C.; Matthias Scholl

(57) ABSTRACT

A mesoscopic solar cell, including: a conductive substrate, a hole blocking layer, a mesoporous nanocrystalline layer, an insulation separating layer, and a hole collecting layer, and perovskite light absorption materials. The hole blocking layer, the mesoporous nanocrystalline layer, the insulation separating layer, and the hole collecting layer are sequentially laminated on the conductive substrate. The perovskite semiconductor materials are filled in the mesoporous nanocrystalline layer, the insulation separating layer, and the hole collecting layer, which enables the mesoporous nanocrystalline layer to be an active light absorption layer operating as a photoanode, and enables the insulation separating layer to be a hole transporting layer.

14 Claims, 1 Drawing Sheet

(56) References Cited

OTHER PUBLICATIONS

English machine translation of CN 101740238 A.*
Snaith et al., "Advances in Liquid-Electrolyte and Solid-State Dye-Sensitized Solar Cells," Adv. Mater. 2007, 19, 3187-3200. (Year: 2007).*
Kojima et al., "Organometal Halide Perovskites as Visible-Light Sensitizers for Photovoltaic Cells," J. Am. Chem. Soc., 2009, 131 (17), pp. 6050-6051. (Year: 2009).*
English machine translation of CN 101740238 A. (Year: 2017).*
A. Kay et al., Low cost photovoltaic modules based on dye sensitized nanocrystalline titanium dioxide and carbon powder, Solar Energy Materials and Solar Cells, Oct. 30, 1996, pp. 99-117, vol. 44, issue 1, Elsevier, Netherlands.
Z. Ku et al., Full printable processed mesoscopic CH3NH3PbI3/TiO2 heterojunction solar cells with carbon counter electrode, Scientific Reports, Nov. 4, 2013, pp. 1-5, Nature Publishing Group, United Kingdom.
Y. Rong et al., Hole-Conductor-Free mesoscopic TiO2/CH3NH3PbI3 heterojunction solar cells based on anatase nanosheets and carbon counter electrodes, The Journal of Physical Chemistry Letters, Jun. 6, 2014, pp. 2160-2164, vol. 5, American Chemical Society, United States.
A. Mei et al., A hole-conductor-free, fully printable mesoscopic perovskite solar cell with high stability, Science, Jul. 18, 2014, pp. 295-298, vol. 345, issue 6194, American Association for the Advancement of Science, United States.
M. Hu et al., Efficient hole-conductor-free, fully printable mesoscopic perovskite solar cells with a broad light harvester NH2CH=NH2PbI3, Journal of Materials Chemistry A, Oct. 28, 2014, pp. 17115-17121, issue 40, The Royal Society of Chemistry, United Kingdom.
Y. Yang et al., The size effect of TiO2 nanoparticles on a printable mesoscopic perovskite solar cell, Journal of Materials Chemistry A, May 7, 2015, pp. 9103-9107, issue 17, The Royal Society of Chemistry, United Kingdom.
L. Zhang et al., The effect of carbon counter electrodes on fully printable mesoscopic perovskite solar cells, Journal of Materials Chemistry A, May 7, 2015, pp. 9165-9170, issue 17, The Royal Society of Chemistry, United Kingdom.
Z. Ku et al., A mesoporous nickel counter electrode for printable and reusable perovskite solar cells, Nanoscale, Aug. 28, 2015, pp. 13363-13368, issue 32, The Royal Society of Chemistry, United Kingdom.
Z. Liu et al., NiO nanosheets as efficient top hole transporters for carbon counter electrode based perovskite solar cells, Journal of Materials Chemistry A, 2015, pp. 24121-24127, issue 47, The Royal Society of Chemistry, United Kingdom.
L. Liu et al., Fully printable mesoscopic perovskite solar cells with organic silane self-assembled monolayer, Journal of the American Chemical Society, Jan. 16, 2015, pp. 1790-1793, vol. 137, issue 5, American Chemical Society, United States.
T. Liu et al., Critical parameters in TiO2/ZrO2/Carbon-based mesoscopic perovskite solar cell, Journal of Power Sources, 2015, pp. 533-538, vol. 293, Elsevier, Netherlands.
Y. Rong et al., Beyond efficiency: the challenge of stability in mesoscopic perovskite solar cells, Advanced Energy Materials, Oct. 21, 2015, pp. 1-16, vol. 5, issue 20, Wiley-VCH, Germany.
K. Cao et al., MAPbI(3-x)Br(x) mixed halide perovskites for fully printable mesoscopic solar cells with enhanced efficiency and less hysteresis, Nanoscale, Apr. 28, 2016, pp. 8839-8846, issue 16, The Royal Society of Chemistry, United Kingdom.
X. Xu et al., Hole selective NiO contact for efficient perovskite solar cells with carbon electrode, Nano Letters, Apr. 2015, pp. 2402-2408, vol. 15, issue 4, American Chemical Society, United States.

J. Chen et al., Hole-Conductor-Free fully printable mesoscopic solar cell with mixed-anion perovskite CH3NH3PbI(3-x)(BF4)x, Advanced Energy Materials, Mar. 9, 2016, pp. 1-6, vol. 6, issue 5, Wiley-VCH, Germany.
G. Niu et al., Study on the stability of CH3NH3PbI3 films and the effect of post-modification by aluminum oxide in all-solid-state hybrid solar cells, Journal of Materials Chemistry A, Jan. 21, 2014, pp. 705-710, issue 3, The Royal Society of Chemistry, United Kingdom.
J. Yang et al., Investigation of CH3NH3PbI3 degradation rates and mechanisms in controlled humidity environments using in situ techniques, ACS Nano, Jan. 30, 2015, pp. 1955-1963, vol. 9, American Chemical Society, United States.
D. Bryant et al., Light and oxygen induced degradation limits the operational stability of methylammonium lead triiodide perovskite solar cells, Energy & Environmental Science, May 1, 2016, pp. 1655-1660, issue 5, The Royal Society of Chemistry, United Kingdom.
A. Pearson et al., Oxygen degradation in mesoporous Al2O3/CH3NH3PbI3-xClx perovskite solar cells: kinetics and mechanisms, Advanced Energy Materials, Jul. 6, 2016, pp. 1-10, vol. 6, issue 13, Wiley-VCH, Germany.
A. Dualeh et al., Thermal behavior of methylammonium leadtrihalide perovskite photovoltaic light harvesters, Chemistry of Materials, Aug. 15, 2014, pp. 6160-6164, vol. 26, American Chemical Society, United States.
B. Conings et al., Intrinsic thermal instability of methylammonium lead trihalide perovskite, Advanced Energy Materials, Aug. 5, 2015, pp. 1-8, vol. 5, issue 15, Wiley-VCH, Germany.
E. Hoke et al., Reversible photo-induced trap formation in mixedhalide hybrid perovskites for photovoltaics, Chemical Science, Jan. 1, 2015, pp. 613-617, issue 1, The Royal Society of Chemistry, United Kingdom.
S. Lee et al., UV degradation and recovery of perovskite solar cells, Scientific Reports, Dec. 2, 2016, pp. 1-10, vol. 6, Nature Publishing Group, United Kingdom.
A. Mei et al., Supplementary materials for a hole-conductor-free, fully printable mesoscopic perovskite solar cell with high stability, Science, Jul. 18, 2014, pp. 1-12, vol. 345, American Association for the Advancement of Science, United States.
H. Zhou et al., Interface engineering of highly efficient perovskite solar cells, Science, Aug. 1, 2014, pp. 542-546, vol. 345, issue 6196, American Association for the Advancement of Science, United States.
H. Zhou et al., Supplementary materials for interface engineering of highly efficient perovskite solar cells, Science, Aug. 1, 2014, vol. 345, American Association for the Advancement of Science, United States.
J. You et al., Improved air stability of perovskite solar cells via solution-processed metal oxide transport layers, Nature Nanotechnology, Jan. 2016, pp. 75-81, vol. 11, Nature Publishing Group, United Kingdom.
W. Chen et al., Supplementary materials for efficient and stable large-area perovskite solar cells with inorganic charge extraction layers, Science, Oct. 29, 2015, American Association for the Advancement of Science, United States.
R. Sanchez et al., Light-induced effects on Spiro-OMeTAD films and hybrid lead halide perovskite solar cells, Solar Energy Materials & Solar Cells, Dec. 2016, pp. 189-194, vol. 158, Elsevier, Netherlands.
X. Li et al., Outdoor performance and stability under elevated temperatures and long-term light soaking of triple-layer mesoporous perovskite photovoltaics, Energy Technology, Jun. 2015, pp. 551-555, vol. 3, issue 6, Wiley-VCH, Germany.

* cited by examiner

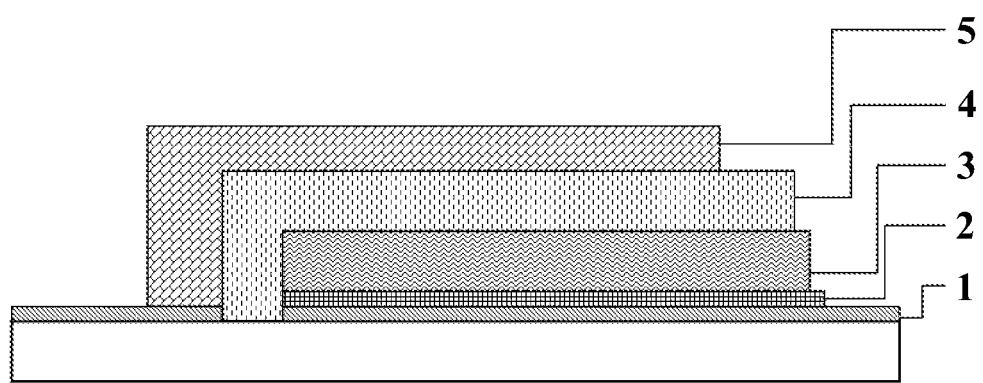

MESOSCOPIC SOLAR CELL BASED ON PEROVSKITE LIGHT ABSORPTION MATERIAL AND METHOD FOR MAKING THE SAME

CROSS-REFERENCE TO RELATED APPLICATIONS

This application is a continuation-in-part of International Patent Application No. PCT/CN2014/072510 with an international filing date of Feb. 25, 2014, designating the United States, now pending, and further claims priority benefits to Chinese Patent Application No. 201310297115.7 filed Jul. 16, 2013. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, and Cambridge, Mass. 02142.

BACKGROUND OF THE INVENTION

Field of the Invention

The invention relates to a mesoscopic solar cell.

Description of the Related Art

Semiconductor nanocrystalline light absorption materials have been widely used for preparation of mesoscopic solar cells.

However, the use of organic semiconductor materials requires an advanced sealing process and vapor deposition of noble metal electrodes, which adversely affects the stability of the cell. Moreover, the vapor deposition of noble metal electrodes greatly increases the production cost, thus restricting the large-scale production and application of mesoscopic solar cells.

SUMMARY OF THE INVENTION

In view of the above-described problems, it is one objective of the invention to provide a mesoscopic solar cell based on perovskite light absorption materials and a method for making the same. The solar cells are capable of directly transporting holes to a hole collecting layer by the hole conductivity of the perovskite semiconductor materials, which solves the problems of poor stability, high requirement for the sealing process of the cell, and high cost in the conventional solar cells.

To achieve the above objective, in accordance with one embodiment of the invention, there is provided a mesoscopic solar cell based on perovskite light absorption materials, comprising a hole blocking layer, a mesoporous nanocrystalline layer, an insulation separating layer, and a hole collecting layer that sequentially layed on a conductive substrate. The mesoporous nanocrystalline layer, the insulation separating layer and the hole collecting layer are filled with perovskite semiconductor materials.

In a class of this embodiment, the mesoporous nanocrystalline layer becomes an active light absorption layer after being filled with the perovskite semiconductor materials.

In a class of this embodiment, the mesoporous nanocrystalline layer is a mesoporous inorganic nano oxide film.

In a class of this embodiment, the insulation separating layer becomes a hole transport layer after being filled with said perovskite semiconductor materials.

In a class of this embodiment, the insulation separating layer is a mesoporous inorganic nano oxide film.

In a class of this embodiment, the hole blocking layer is a compact titania film.

In a class of this embodiment, the perovskite semiconductor material is $ABX_3$, where A is alkylamine or an alkali element, B is lead or tin, and X is selecting from the group of iodine, bromide and chlorine.

In a class of this embodiment, the perovskite semiconductor material is preferably methylamine lead iodine ($CH_3NH_3PbI_3$).

In a class of this embodiment, the inorganic and mesoporous nano oxide is selecting from the group of titania, zirconia, alumina, Stannum, Zinc, nickel and silica.

In accordance with another embodiment of the invention, there is provided a method for preparing a mesoscopic solar cell based on perovskite light absorption materials, comprising steps of:

1) preparing a hole blocking layer on a conductive substrate;
2) preparing and sintering a mesoporous nanocrystalline layer, an insulation separating layer and a hole collecting layer on the hole blocking layer in order; and
3) drop-coating precursor solution on the hole collecting layer so that the precursor solution penetrates the pores of the mesoporous nanocrystalline layer via the hole collecting layer from top to bottom, and drying a product to obtain a mesoscopic solar cell.

In a class of this embodiment, the mesoporous nanocrystalline layer and the insulation separating layer are inorganic and mesoporous nano oxide films.

In a class of this embodiment, the mesoporous nanocrystalline layer, the insulation separating layer, and the hole collecting layer are laminatedly prepared by screen-printing or doctor-blading.

In a class of this embodiment, the hole blocking layer is a compact titania film.

In a class of this embodiment, the perovskite semiconductor material is $ABX_3$, where A is alkylamine or an alkali element, B is lead or tin, and X is selecting from the group of iodine, bromide and chlorine, and preferably methylamine lead iodine ($CH_3NH_3PbI_3$).

In a class of this embodiment, the mesoporous inorganic nano oxide is selecting from the group of titania, zirconia, alumina, and silica.

In a class of this embodiment, the method further comprises a step of filling an auxiliary p-type semiconductor thereby optimizing the hole transport property of the mesoporous nanocrystalline layer, insulation separating layer and the hole collecting layer after step (3).

The solar cell of the invention comprises a conductive substrate, a hole blocking layer, a mesoporous nanocrystalline layer, an insulation separating layer, and a hole collecting layer. The mesoporous nanocrystalline layer, insulation separating layer and hole collecting layer in the above-mentioned step (2) are prepared by screen-printing, which requires no vacuum environment compared with a conventional vapor deposition method, and thus being capable of simplifying the preparation of the cell, and reducing production cost thereof.

The mesoporous inorganic nano oxide of the invention is selecting from the group of titania, zirconia, alumina, Stannum, Zinc, nickel and silica, and a grain size thereof is preferably 10-400 nm. The hole collecting layer is preferably made of a high work function electrode material such as carbon, indium tin oxide and so on. A thickness of the film is preferably 50 nm-10 μm, and a sintering temperature is 400-500° C.

To summarize, the mesoscopic solar cell of the invention is prepared by a fully screen-printing method, in which the perovskite nanocrystalline is used as an active light absorption material, the hole transport layer is formed in the insulation separating layer by utilizing the hole transport property of the perovskite to directly transport holes to the hole collecting layer, and thus no organic p-type material is used. In addition, comparatively cheap materials, such as mesoporous carbon, are used as the hole collecting layer, which effectively simplifies the preparation process of the solar cell, reduces production cost thereof, and enables the invention to have a good industrialization prospect.

BRIEF DESCRIPTION OF THE DRAWINGS

The invention is described hereinbelow with reference to accompanying drawings, in which the sole FIGURE is a schematic view of a mesoscopic solar cell based on perovskite light absorption materials of an exemplary embodiment of the invention.

In the FIGURE, the following reference numbers are used: 1. Conductive substrate; 2. Hole blocking layer; 3. Mesoporous nanocrystalline layer; 4. Insulation separating layer; 5. Hole collecting layer.

DETAILED DESCRIPTION OF THE EMBODIMENTS

For further illustrating the invention, experiments detailing an epoxy caulking adhesive are described below. It should be noted that the following examples are intended to describe and not to limit the invention.

Structure of a mesoscopic solar cell of the invention is illustrated in the sole FIGURE, where the cell comprises, from top to bottom, a conductive substrate 1, a hole blocking layer 2, a mesoporous nanocrystalline layer 3, an insulation separating layer 4, and a hole collecting layer 5.

The mesoporous nanocrystalline layer 3, the insulation separating layer 4 and the hole collecting layer 5 are filled with perovskite semiconductor materials. The mesoporous nanocrystalline layer 3 becomes an active light absorption layer after being filled with the perovskite semiconductor materials, and the insulation separating layer 4 becomes a hole transport layer after being filled with the perovskite semiconductor materials.

In addition, the mesoporous nanocrystalline layer 3 and the insulation separating layer 4 are nano oxide films. For example, the nano oxide film is selecting from the group of titania, zirconia, alumina Stannum, Zinc, nickel and silica.

Preferably, the mesoporous nanocrystalline layer, the insulation separating layer, and the hole collecting layer are prepared by screen-printing layer by layer.

After sintering, the mesoporous nanocrystalline layer filled with the perovskite semiconductor materials becomes an active mesoporous nanocrystalline layer as the photoanode of the cell, and the insulation separating layer filled with the perovskite semiconductor materials becomes the hole transport layer transporting holes to the hole collecting layer.

After being filled with the perovskite semiconductor materials, the insulation separating layer being the nano oxide film can replace a conventional organic p-type semiconductor material and operates as a hole transport layer of the cell due to its hole transport capability. Moreover, the invention uses comparatively cheap materials, such as mesoporous carbon, as the hole collecting layer, and utilizes hole transport property of the perovskite semiconductor materials to transport holes to the hole collecting layer, which avoid the use of the organic p-type material.

A method for preparing the mesoscopic solar cell of the invention will be described in details hereinafter with reference to specific examples:

Example 1

Firstly conductive glass is used as the conductive substrate 1, then a compact titania layer 2 (with a thickness of 50 nm, for example) is deposited on the substrate, and finally a titania mesoporous nanocrystalline layer 3, a zirconia insulation separating layer 4, a carbon-electrode hole collecting layer 5 are sequentially prepared by screen-printing from the bottom to the top.

For example, the titania layer has a grain size of 18 nm with a thickness of around 1 μm, and the insulation separating zirconia layer has a grain size of 20 nm with a thickness of 1 μm. The carbon-electrode hole collecting layer is a mesoporous conductive film made of graphite and carbon black with a thickness of approximately 10 μm. Certain amount (for example 4 μL) of methylamine lead iodine ($CH_3NH_3PbI_3$) precursor solution (30 wt. %) is added on the mesoporous conductive film drop by drop, kept for 1 minute until it sufficiently penetrates in the titania mesoporous nanocrystalline layer, and finally dried at a certain temperature (for example 50° C.). Test results indicate that the obtained solar cell has an efficiency of 6.64% under simulated sunlight of 100 mW/cm$^2$.

Example 2

Firstly conductive glass is used as the conductive substrate 1, then a compact titania layer 2 (with a thickness of 50 nm, for example) is deposited on the substrate, and finally a titania mesoporous nanocrystalline layer 3, an alumina insulation separating layer 4, a carbon-electrode hole collecting layer 5 are sequentially prepared by screen-printing from the bottom to the top.

For example, the titania layer has a grain size of 18 nm with a thickness of around 1 μm, and the insulation separating alumina layer has a grain size of 20 nm with a thickness of 1 μm. The carbon-electrode hole collecting layer is a mesoporous conductive film made of graphite and carbon black with a thickness of approximately 10 μm. Certain amount (for example 4 μL) of methylamine lead iodine ($CH_3NH_3PbI_3$) precursor solution (30 wt. %) is added on the mesoporous conductive film drop by drop, kept for 1 minute until it sufficiently penetrates in the titania mesoporous nanocrystalline layer, and finally dried at a certain temperature (for example 50° C.). Test results indicate that the obtained solar cell has an efficiency of 6.03% under simulated sunlight of 100 mW/cm$^2$.

Example 3

Firstly conductive glass is used as the conductive substrate 1, then a compact titania layer 2 (with a thickness of 50 nm, for example) is deposited on the substrate, and finally a titania mesoporous nanocrystalline layer 3, a zirconia insulation separating layer 4, a carbon-electrode hole collecting layer 5 are sequentially prepared by screen-printing from the bottom to the top.

For example, the titania layer has a grain size of 18 nm with a thickness of around 1 μm, and the insulation separating zirconia layer has a grain size of 20 nm with a thickness of 1 μm. The carbon-electrode hole collecting layer is a mesoporous conductive film made of graphite and carbon black with a thickness of approximately 10 μm. Certain amount (for example 4 μL) of methylamine lead iodine/bromide ($CH_3NH_3PbI_2Br$) precursor solution (30 wt.

%) is added on the mesoporous conductive film drop by drop, kept for 1 minute until it sufficiently penetrates in the titania mesoporous nanocrystalline layer, and finally dried at a certain temperature (for example 50° C.). Test results indicate that the obtained solar cell has an efficiency of 5.87% under simulated sunlight of 100 mW/cm$^2$.

Example 4

Firstly conductive glass is used as the conductive substrate 1, then a compact titania layer 2 (with a thickness of 50 nm, for example) is deposited on the substrate, and finally a titania mesoporous nanocrystalline layer 3, a zirconia insulation separating layer 4, a indium-tin-oxide-electrode hole collecting layer 5 are sequentially prepared by screen-printing from the bottom to the top.

For example, the titania layer has a grain size of 18 nm with a thickness of around 1 μm, and the insulation separating zirconia layer has a grain size of 20 nm with a thickness of 1 μm. The indium-tin-oxide-electrode hole collecting layer is a mesoporous conductive film made of indium tin oxide nanocrystalline and having a thickness of approximately 10 μm. Certain amount (for example 4 μL) of methylamine lead iodine ($CH_3NH_3PbI_3$) precursor solution (30 wt. %) is added on the mesoporous conductive film drop by drop, kept for 1 minute until it sufficiently penetrates in the titania mesoporous nanocrystalline layer, and finally dried at a certain temperature (for example 50° C.). Test results indicate that the obtained solar cell has an efficiency of 5.15% under simulated sunlight of 100 mW/cm$^2$.

In the above-mentioned examples, the conductive substrate 1 is preferably conductive glass or conductive plastics. The hole blocking layer 2 is an inorganic metal oxide film, and preferably a compact titania film with a thickness of 50 nm, but not limited to the titania film, and the thickness can be adjusted as required (for example 50 nm-10 μm). The mesoporous nanocrystalline layer 3 and the insulation separating layer 4 are nano oxide films, the mesoporous nanocrystalline layer 3 is preferably titania mesoporous nanocrystalline layer, but not limited to titania, the grain size also is not limited to 18 nm, the insulation separating layer 4 is preferably zirconia, and the grain size and thickness also are not limited to the above examples, and can be adjusted as required (for example 50 nm-10 μm). The hole collecting layer 5 is an electrode layer made of mesoporous materials, and preferably high work function electrode materials comprising carbon, indium tin oxide and so on, but not limited to these materials.

A chemical formula of the perovskite semiconductor material is $ABX_3$, where A is selecting from the group of alkylamine and an alkali element, B is selecting from the group of lead and tin, and X is selecting from the group of iodine, bromide and chlorine, and preferably methylamine lead iodine ($CH_3NH_3PbI_3$).

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:
1. A mesoscopic solar cell, comprising: a conductive substrate, a hole blocking layer, a nanocrystalline layer comprising a material for absorbing light, an insulation separating layer comprising a material for transporting holes, and a hole collecting layer;
wherein:
   each of the nanocrystalline layer, the insulation separating layer, and the hole collecting layer is a mesoporous film;
   the hole blocking layer, the nanocrystalline layer, the insulation separating layer, and the hole collecting layer are sequentially laminated on the conductive substrate;
   each of the nanocrystalline layer, the insulation separating layer, and the hole collecting layer is filled with a perovskite semiconductor material;
   the material for absorbing light consists of the perovskite semiconductor material;
   the material for transporting holes consists of the perovskite semiconductor material; and
   the perovskite semiconductor material is simultaneously the material for absorbing light in the nanocrystalline layer and the material for transporting holes in the insulation separating layer.

2. The cell for claim 1, wherein the nanocrystalline layer comprises a first mesoporous inorganic nano oxide film; the insulation separating layer comprises a second mesoporous inorganic nano oxide film; and the hole collecting layer comprises a mesoporous conductive film.

3. The cell for claim 2, wherein the first mesoporous inorganic nano oxide film and the second mesoporous inorganic nano oxide film comprise titania, zirconia, alumina, Stannum, Zinc, nickel, silica, or a combination thereof.

4. The cell for claim 1, wherein the perovskite semiconductor material is $ABX_3$, where A is alkylamine or an alkali element, B is lead or tin, and X is iodine, bromide, or chlorine.

5. The cell for claim 3, wherein the perovskite semiconductor material is $ABX_3$, where A is alkylamine or an alkali element, B is lead or tin, and X is iodine, bromide, or chlorine.

6. The cell for claim 1, wherein the hole blocking layer is a compact titania film.

7. The cell for claim 1, wherein the filling of the perovskite semiconductor material is achieved through the way that a perovskite precursor solution is drop-casted on the hole collecting layer, and then penetrates pores of the nanocrystalline layer via the hole collecting layer from top to bottom.

8. A mesoscopic solar cell, comprising: a conductive substrate, a hole blocking layer, a nanocrystalline layer, an insulation separating layer, a hole collecting layer, and a perovskite semiconductor material;
wherein:
   each of the nanocrystalline layer, the insulation separating layer, and the hole collecting layer is a mesoporous film;
   the hole blocking layer, the nanocrystalline layer, the insulation separating layer, and the hole collecting layer are sequentially laminated on the conductive substrate;
   the perovskite semiconductor material is filled in each of the nanocrystalline layer, the insulation separating layer, and the hole collecting layer;
   the perovskite semiconductor material is simultaneously a light absorption material for absorbing light in the nanocrystalline layer and a material for transporting holes in the insulation separating layer; and
   an organic p-type material is not filled in the nanocrystalline layer, the insulation separating layer, or the hole collecting layer.

9. The cell for claim 8, wherein the nanocrystalline layer comprises a first mesoporous inorganic nano oxide film; the insulation separating layer comprises a second mesoporous inorganic nano oxide film; and the hole collecting layer comprises a mesoporous conductive film.

10. The cell for claim 9, wherein the first mesoporous inorganic nano oxide film and the second mesoporous inorganic nano oxide film comprise titania, zirconia, alumina, stannum, zinc, nickel, silica, or a combination thereof.

11. The cell for claim 8, wherein the perovskite semiconductor material is $ABX_3$, where A is alkylamine or an alkali element, B is lead or tin, and X is iodine, bromide, or chlorine.

12. The cell for claim 10, wherein the perovskite semiconductor material is $ABX_3$, where A is alkylamine or an alkali element, B is lead or tin, and X is iodine, bromide, or chlorine.

13. The cell for claim 8, wherein the hole blocking layer is a compact titania film.

14. The cell for claim 8, wherein the filling of the perovskite semiconductor material is achieved through the way that a perovskite precursor solution is drop-casted on the hole collecting layer, and then penetrates pores of the nanocrystalline layer via the hole collecting layer from top to bottom.

* * * * *